United States Patent [19]
Nolan et al.

[11] Patent Number: 6,020,792
[45] Date of Patent: Feb. 1, 2000

[54] PRECISION RELAXATION OSCILLATOR INTEGRATED CIRCUIT WITH TEMPERATURE COMPENSATION

[75] Inventors: James B. Nolan; Hartono Darmawaskita, both of Chandler; R. Scott Ellison; David Susak, both of Phoenix, all of Ariz.

[73] Assignee: Microchip Technology Inc., Chandler, Ariz.

[21] Appl. No.: 09/044,361

[22] Filed: Mar. 19, 1998

[51] Int. Cl.[7] .................... H03K 3/0231; H03K 3/353; H03L 1/02
[52] U.S. Cl. ................... 331/111; 331/143; 331/176
[58] Field of Search .................... 331/111, 143, 331/176

[56] References Cited

U.S. PATENT DOCUMENTS

| | | | |
|---|---|---|---|
| 3,725,681 | 4/1973 | Frederiksen | 331/111 |
| 4,255,721 | 3/1981 | Wilson, Jr. | 331/111 |
| 4,931,750 | 6/1990 | Gontowski | 331/111 |
| 5,870,345 | 2/1999 | Stecker | 331/111 |

*Primary Examiner*—Siegfried H Grimm
*Attorney, Agent, or Firm*—Paul N. Katz; Ronald L. Chichester; Frohwitter

[57] ABSTRACT

A precision relaxation oscillator with temperature compensation produces a stable clock frequency over wide variations of ambient temperature. The invention has a oscillation generator and two independent current generators. The outputs of the two programmable, independent current generators are combined to provide a capacitor charging current which is independent of temperature. The precision relaxation oscillator with temperature compensation is implemented on a single, monolithic integrated circuit.

21 Claims, 5 Drawing Sheets

PRECISION RELAXATION OSCILLATOR INTEGRATED CIRCUIT WITH TEMPERATURE COMPENSATION

BACKGROUND OF THE INVENTION

1. Field of the Invention

This invention relates generally to integrated circuits which produce clock frequencies. Specifically, the present invention is a precision relaxation oscillator that produces a stable clock frequency over wide variations of ambient temperature, fabrication process and voltage. The invention is implemented on a single, monolithic integrated circuit.

2. Description of the Prior Art

The current state of the art describes RC relaxation oscillators which primarily depend on one of two schemes. In the first example as found in FIG. 1, a single comparator is coupled to a pulse generator to alternately charge and discharge a capacitor to produce a clock for a "D type" flip-flop. Several error sources are present in this design. The resistor and capacitor typically have unpredictable voltage and temperature coefficients. The charging current and comparator input slew are a function of the supply voltage which is also subject to drift. Also, the pulse generator output may vary with temperature and supply voltage. These factors lead to a clock frequency that varies over temperature.

In a second example as illustrated in FIG. 2, an RC circuit provides a common input to each of two comparators. Independent reference voltages are coupled to each of the remaining inputs of the comparators. The outputs of each of the two comparators are coupled to the inputs of a "Set-Reset type" flip-flop. The output of the flip-flop serves to alternately charge and discharge the capacitor. Although this circuit eliminates the inaccuracies of the pulse generator as discussed above in FIG. 1, other problems manifest themselves. A duty cycle error may occur since it is unlikely that the capacitor will charge and discharge at the same rate, especially over temperature variations. Also, error is induced by the difficulty of providing two reference voltages which track each other coincidently over temperature.

Therefore, a need existed to provide a relaxation oscillator which is capable of maintaining a stable clock frequency independent of temperature.

SUMMARY OF THE INVENTION

It is an object of the present invention to provide a relaxation oscillator which is capable of maintaining a stable clock frequency independent of temperature. A stable clock is defined as one which maintains a stable frequency in an environment which is subject to temperature fluctuations.

It is another object of the present invention to provide a relaxation oscillator which minimizes the temperature coefficient of the oscillator as measured in parts per million of the clock frequency divided by temperature (ppm/deg C). For example, one part per million per degree centigrade for a clock frequency of 4 MHz equates to 4 clock cycles.

It is another object of the present invention to provide a relaxation oscillator which is immune to frequency drift due to process and supply voltage.

In accordance with one embodiment of the present invention, a precision relaxation oscillator that produces a stable clock frequency over wide variations of ambient temperature is disclosed. The precision relaxation oscillator is comprised of an oscillation generator, a first current generator for producing a first output current and a second current generator for producing a second output current. The invention is implemented on a single, monolithic integrated circuit.

In accordance with another embodiment of the present invention an external resistor may be coupled to either the first or second current generators to produce the respective output currents required for determining the clock frequency.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 3:
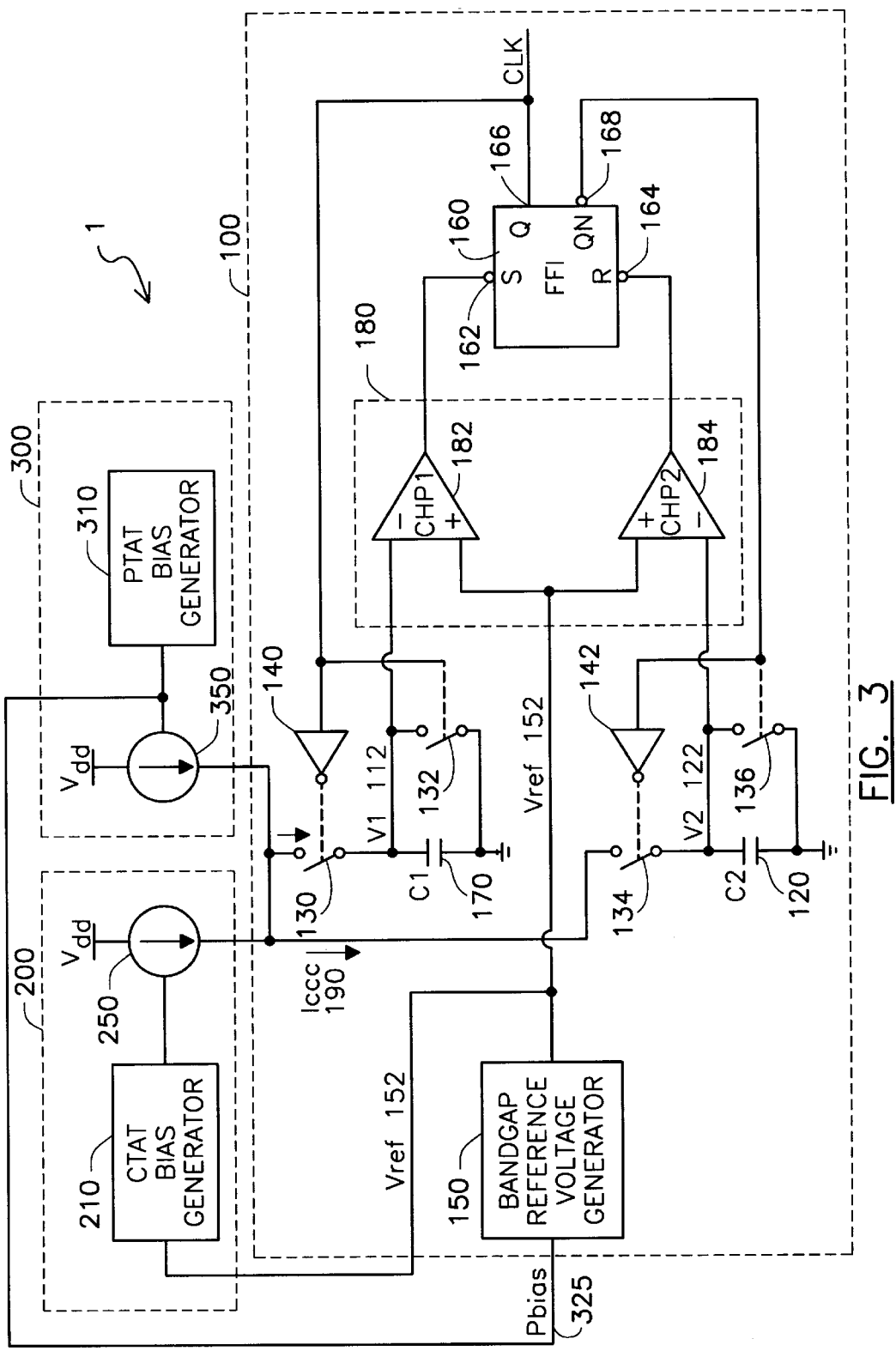
FIG. 3 is a block diagram of the present invention.

Referring to FIG. 3, a precision relaxation oscillator 1 that produces a stable clock frequency over wide variations of ambient temperature is shown. Preferably, the precision relaxation oscillator 1 produces a stable clock frequency in the range of approximately 1 KHz to 8 MHz. However, those skilled in the art will recognize that the present invention is riot limited to a specific frequency range.

The precision relaxation oscillator 1 is comprised of an oscillation generator 100, a first current generator 200 which is typically a Complementary to Absolute Temperature (CTAT) current generator and a second current generator 300 which is typically a Proportional to Absolute Temperature (PTAT) current generator. In the preferred embodiment of the present invention, the precision relaxation oscillator 1 is implemented on a single, monolithic integrated circuit.

The CTAT 200 and PTAT 300 current generators are independently implemented and yield several important functions to the present invention. The CTAT 200 and PTAT 300 current generators compensate for the effects that temperature variation has on the internal components of the device such as resistors, capacitors and comparators by providing offsetting currents CTAT current 220 and PTAT current 320, i.e. currents with opposite slopes with respect to temperature. CTAT current 290 and PTAT current 390 (FIGS. 4 & 5) are combined to form a capacitor charging current $I_{CCC}$ 190 ($I_{CCC}$ 190=CTAT current 290+PTAT current 390). The combining, or summing of the CTAT current 290 and PTAT current 390 occurs when introduced to the oscillation generator 100 for charging a first capacitor 110 and a second capacitor 120. Because the CTAT 290 and PTAT 390 currents are approximately linear and of opposite slope with respect to temperature, the result of the summation is an $I_{ccc}$ 190 that is nearly independent of temperature.

In the preferred embodiment, the oscillation generator 100 is comprised of a set-reset flip-flop 160, a comparator circuit 180 further comprised of two comparators 182 & 184, two capacitors 110 & 120, four transistor switches 130, 132, 134 & 136, two inverters 140 & 142 and a bandgap reference voltage circuit 150 for producing a reference voltage 152.

The transistor switches 130 & 134 provide charging paths for the capacitors 110 & 120, respectively. The transistor switches 132 & 136 provide discharging paths for the capacitors 110 & 120, respectively. In the preferred embodiment, the transistor switches 130, 132, 134 and 136 are MOSFET transistors, however, those skilled in the art will recognize that the invention is not limited to this technology.

The oscillation generator 100 operates by having one capacitor charge while the other capacitor discharges. The discharge path for the capacitor 110 is connected via transistor switch 132 to an input of the comparator 182. The discharge path for the capacitor 120 is connected via transistor switch 136 to an input of the comparator 184.

In the preferred embodiment and for best performance, a stable reference voltage source such as a bandgap reference voltage circuit 150 is used. The bandgap reference voltage circuit 150 provides a single reference voltage 152, which is connected to second inputs of comparators 182 & 184, and is used to set the common mode voltage at each comparator 182 & 184 and at the CTAT current generator 200. The $P_{BIAS}$ input 325 for the bandgap reference voltage circuit 150 is an output of the PTAT bias generator 310 which is described below. The bandgap reference voltage circuit 150 has the advantage of stabilizing capacitor charging current and minimizing the error due to variance in comparator input slew and propagation delay. Furthermore, in order to cancel, or at the very least minimize, the effects of reference voltage drift, the CTAT 200 current generator relies on the same reference voltage 152 as the comparators 182 & 184. For example, if the reference voltage 152 increases, the CTAT current 290 (FIG. 4), which is equal to $V_{REF}/R$, also increases. Without compensation elsewhere, this increased CTAT current 290 would result in a faster clock frequency 166, because a greater $I_{CCC}$ 190 is produced, which results in faster charging of the capacitors 110 and 120. However, the capacitors 110 and 120 must charge to a greater level for the comparators 182 and 184 to trip with respect to the increased reference voltage 152. Thus, the present invention requires a simpler, less costly reference voltage source to achieve clock frequency stability. There are various embodiments of the bandgap reference voltage circuit 150, as well as other reference voltage sources such as voltage dividers, which are well known to those skilled in the art. However, the novel way in which the bandgap reference voltage circuit 150 is implemented in the present invention is not disclosed by the prior art.

The output of comparator 182 is connected to the set input 162 of the flip-flop 160. The output of comparator 184 is connected to the reset input 164 of the flip-flop 160. Thus, as the capacitors 110 and 120 alternatively charge and discharge, the outputs of the comparators 182 & 184 alternatively set and reset the flip-flop 160 thus producing a clock output.

The Q output 166 of the flip-flop 160 provides a stable clock frequency that is independent of temperature variation. In the preferred embodiment, the Q output 166 is also routed to transistor switch 132 and via inverter 140 to transistor switch 130. Thus the Q output 166 provides the signal that controls the transistor switches 130 & 132 which in turn open and close the charging and discharging paths for capacitor 110.

The complementary Q output 168 of flip-flop 160 provides a second stable clock frequency that is also independent of temperature and the complement of Q output 166. The complementary Q output 168 is routed to transistor switch 136 and via inverter 142 to transistor switch 134. Thus the complementary Q output 168 provides the signal that controls the transistor switches 134 & 136 which in turn open and close the charging and discharging paths for capacitor 120.

Figure 4:
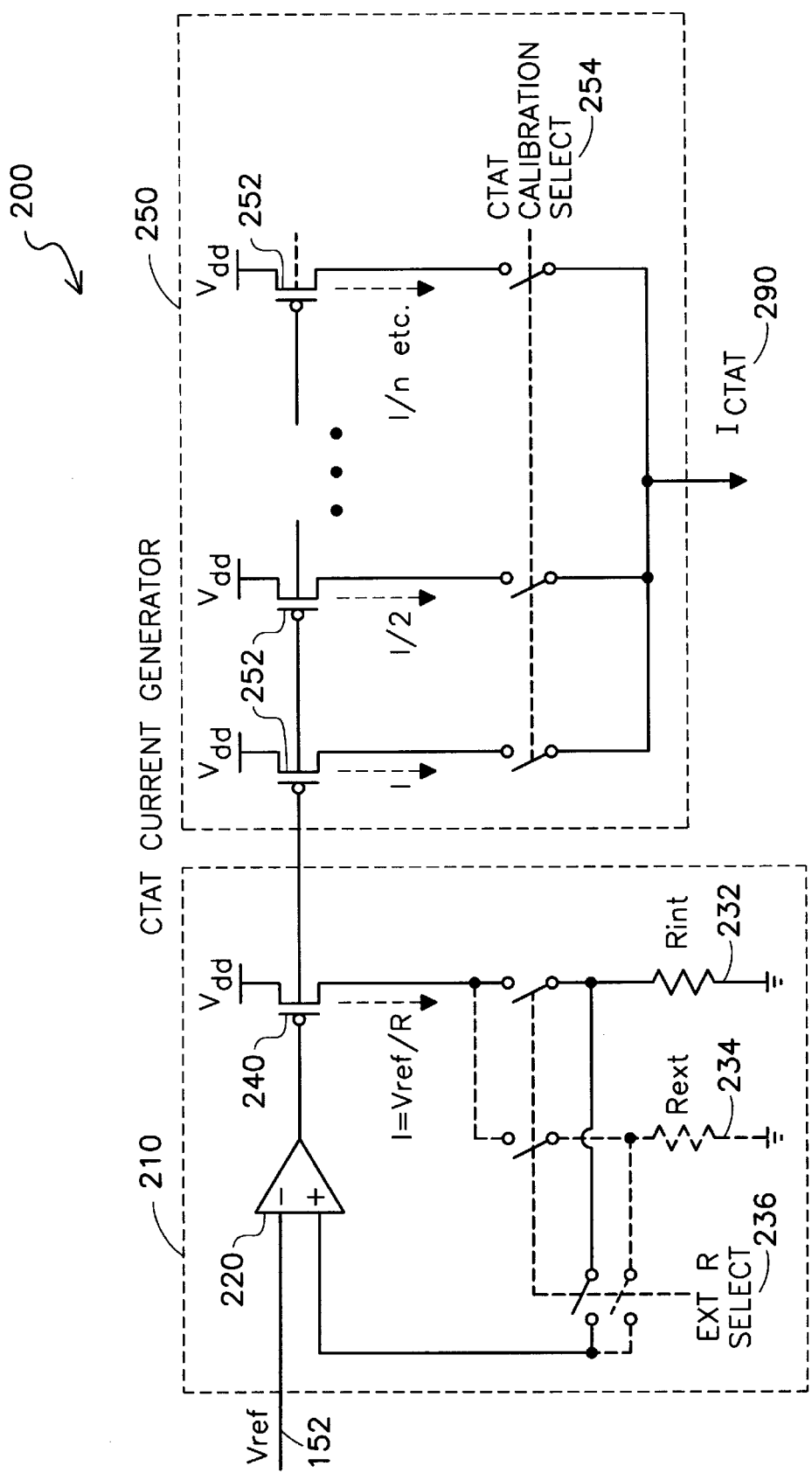
FIG. 4 is a block diagram of the CTAT current generator found in the present invention.

Referring to FIG. 4, wherein like numerals reflect like elements, the CTAT current generator 200 is comprised of a CTAT bias generator 210 and a current mirror 250 for producing the CTAT current 290. The CTAT bias generator 210 is comprised of an amplifier circuit 220, at least one resistor 232 & 234 with a small positive temperature coefficient for regulating the input current to the amplifier and a transistor 240 for providing an input current to the amplifier 220. The amplifier 220 is a cascode configuration for supply and noise rejection. The reference voltage 152 is coupled to an input of the amplifier 220. The present invention provides that an external resistor 234 may be selected over the internal resistor 232 by a select bit 236 for controlling the current sent to the current mirror 250 and thus, for producing a stable clock frequency independent of temperature.

The current mirror 250 is comprised of a plurality of transistors 252 from one to n. The output the CTAT bias generator amplifier 220 is coupled to the current mirror transistors 252. Trimming the CTAT current 290 for achieving the proper CTAT:PTAT balance is programmed digitally by selecting or enabling one or more of the current mirror transistors 252 via the calibration select 254, which would sum, to obtain the desired CTAT current 290. In the preferred embodiment, the current mirror 250 acts as a current divider which is well known to those skilled in the art. In other embodiments the current mirror 250 may be configured as a current multiplier. The CTAT current 290 is the sum of the selected outputs from the current mirror transistors 252.

Figure 1:
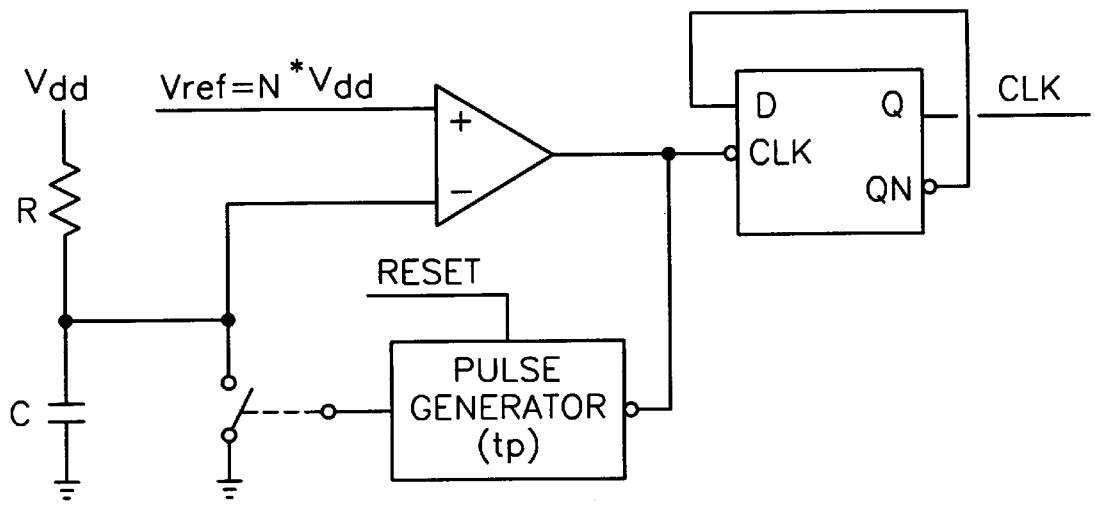
FIG. 1 is a schematic diagram of the prior art showing a simple RC Relaxation Oscillator with a pulse generator.
Figure 2:
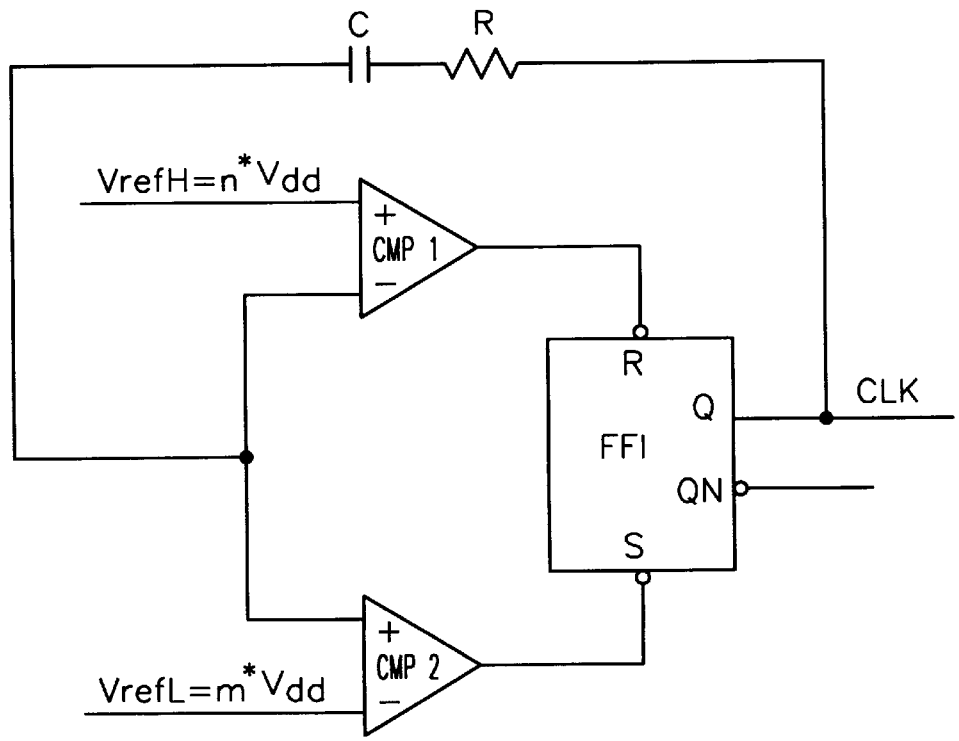
FIG. 2 is a schematic diagram of the prior art showing a dual comparator RC Relaxation Oscillator.
Figure 5:
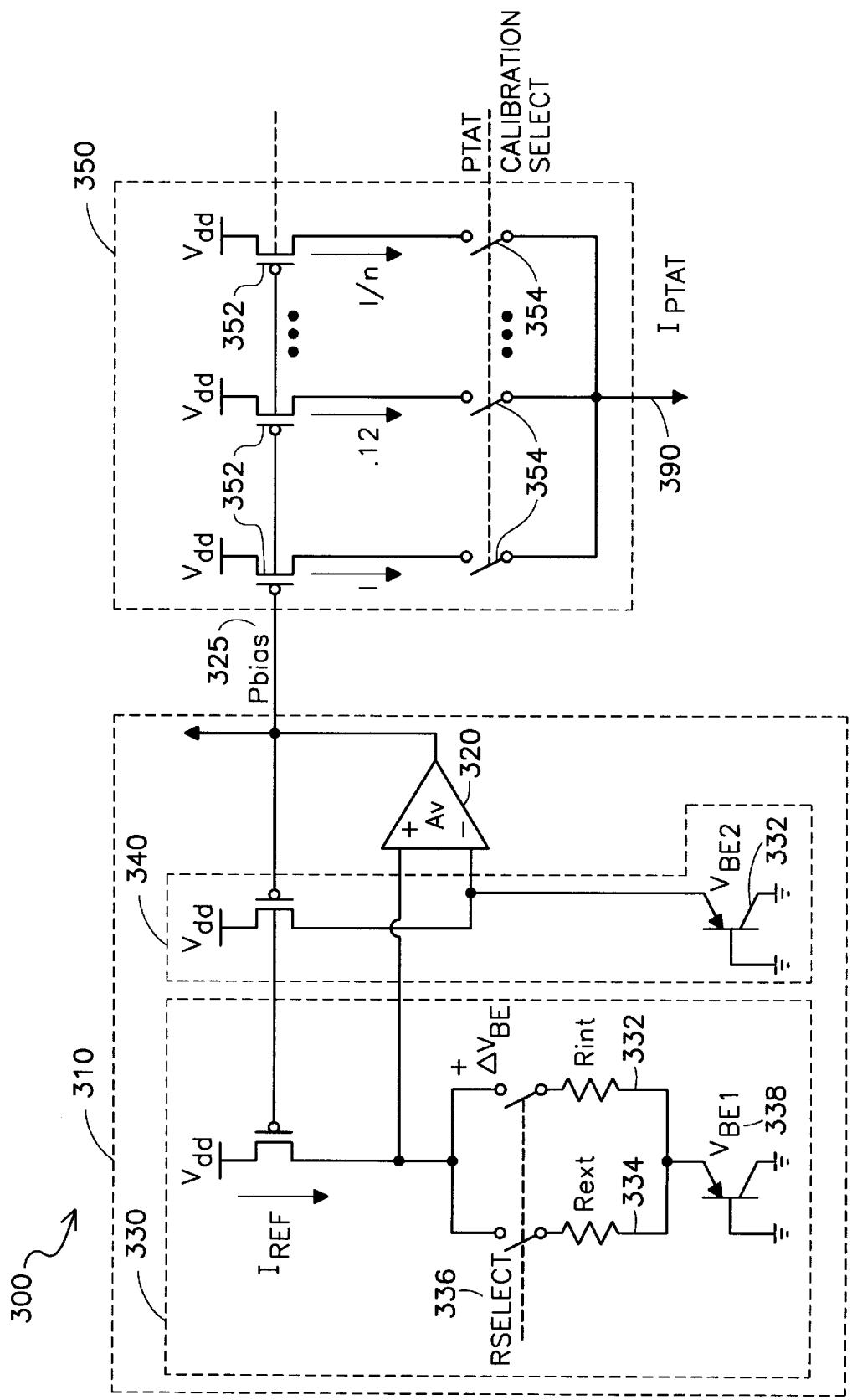
FIG. 5 is a block diagram of the PTAT current generator found in the present invention.

Referring to FIG. 5, wherein like numerals reflect like elements, the PTAT current generator 300, known to those skilled in the art as a $\Delta V_{BE}$ circuit, is comprised of PTAT bias generator 310 and a PTAT current mirror 350 for producing a PTAT current 390. The PTAT bias generator 310 is comprised of an amplifier circuit 320, a first bias circuit 330 for producing a first bias voltage across a selectable resistor with a small linear temperature coefficient 332 or 334 and a second bias circuit 340 for producing a second bias voltage. The first and second bias voltages provide the inputs to the amplifier 320. The output of the amplifier 320 is $P_{BIAS}$ 325 which is coupled to the first 330 and second 340 bias circuits, the PTAT current mirror 350 and the bandgap reference voltage generator 150 (FIG. 1). Similar to the CTAT current generator 200, the present invention provides that an external resistor 334 may be selected over the internal resistor 332 by a select bit 336 for controlling the current sent to the current mirror 350 and thus, for producing a stable clock frequency independent of temperature.

The PTAT current mirror 350 is comprised of a plurality of transistors 352 from one to n. Trimming is performed digitally by programming the selection or enablement of one or more of the current mirror transistors 352 via the calibration select 354 to obtain the desired PTAT current 390. In the preferred embodiment, the current mirror 350 acts as a current divider which is well known to those skilled in the art. In other embodiments the current mirror 350 may be configured as a current multiplier. The PTAT current 390 is the sum of the selected outputs from the current mirror transistors 352.

Figure 6:
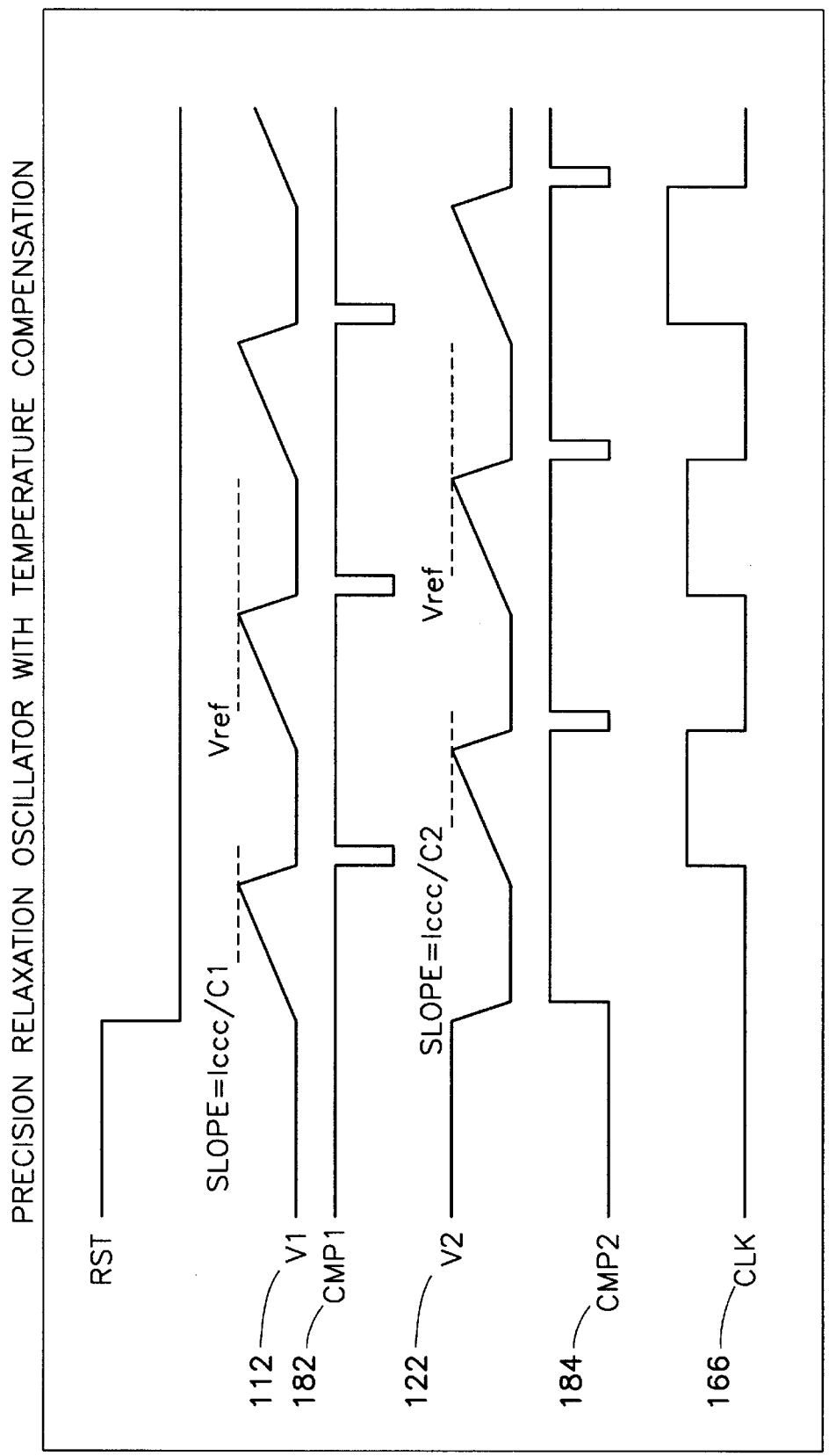
FIG. 6 is a timing diagram of specific parameters of the present invention.

Referring to FIG. 6, wherein like numerals reflect like elements, a timing diagram for the relaxation oscillator 1 is shown. V1 112 reflects the charging and discharging of capacitor 110 (FIG. 1). Note that the positive slope (charging) of V1 112 is equal to $I_{CCC}$ 190 divided by the capacitance of capacitor 110. The maximum amplitude of V1 112 is equal to the reference voltage 152. CMP1 reflects the output of the comparator 182 which is coupled to the set input 162 of the flip-flop 160.

V2 122 reflects the charging and discharging of capacitor 120. In this case the positive slope of V2 122 is equal to $I_{CCC}$ 190 divided by the capacitance of capacitor 120. CMP2 reflects the output of the comparator 184 which is coupled to the reset input 164 of the flip-flop 160. CLK is the Q output 166 of the flip-flop 160.

For a 50 percent duty cycle, the values of capacitors 110 & 120 are identical which result in similar slopes for V1 112 and V2 122. As the capacitor voltage exceeds the reference voltage 152, the respective comparator 182 & 184 pulses low which causes the flip-flop 160 to change state. RST (reset) is used to initialize the comparators 182 & 184 and the flip-flop 160 to a known state.

The present invention minimizes clock frequency drift due to fabrication process, supply voltage and temperature variances. This is accomplished by providing offsetting bias currents which when summed are independent of temperature variation, trimming via the programmable current mirrors 250 & 350 to eliminate process variations, using a stable voltage reference such as a bandgap reference voltage circuit 150 and a dual capacitor, dual comparator oscillation generator 100. Also, analog design techniques, well known to those skilled in the art, such as component matching and cascode current sources enhance the stability of the circuit.

Although the invention has been particularly shown and described with reference to a preferred embodiment thereof, it will be understood by those skilled in the art that changes in form and detail may be made therein without departing from the spirit and scope of the invention.

What is claimed is:

1. A precision relaxation oscillator with temperature compensation circuit, said oscillator comprising:
    a first current generator having an output;
    a second current generator having an output; and
    an oscillation generator coupled to said outputs of said first and said second current generators in order to receive current therefrom, wherein said oscillation generator comprises:
        at least one capacitor coupled to the outputs of said first and second current generators for being charged by said current generators;
        a reference voltage circuit generating a reference voltage;
        a comparator circuit coupled to said at least one capacitor and to said reference voltage circuit, said comparator circuit being arranged to compare the voltage across said at least one capacitor with said reference voltage;
        a flip-flop controlled by said comparator circuit;
        at least one inverter driven by said flip-flop; and
        a switch circuit controlled by said flip-flop and by said at least one inverter; said switch circuit being coupled to said at least one capacitor and to said first and said second current generators for charging and discharging said at least one capacitor according to the control by said flip-flop and by said at least one inverter;
    wherein said first current generator is coupled to said reference voltage circuit to enable said first current generator to control the effects of reference voltage drift and wherein said oscillator is implemented on a single integrated circuit.

2. A precision relaxation oscillator with temperature compensation circuit, said oscillator comprising:
    a first current generator having an output;
    a second current generator having an output; and
    an oscillation generator coupled to the outputs of said first and second current generators for receiving current therefrom;
    wherein said oscillation generator comprises:
        a first and a second capacitors coupled to the outputs of said first and second current generators for being charged by said current generators;
        a reference voltage circuit generating a reference voltage;
        a comparator circuit coupled to said first and second capacitors and to said reference voltage circuit, said comparator circuit being arranged to compare the voltage across said first and second capacitors with said reference voltage;
        a flip-flop controlled by said comparator circuit;
        at least one inverter driven by said flip-flop; and
        a switch circuit controlled by said flip-flop and by said at least one inverter; said switch circuit being coupled to said first and second capacitors and to said first and second current generators for charging and discharging said first and second capacitors according to the control by said flip-flop and by said at least one inverter;
    wherein said switch circuit comprises:
        a first plurality of switches coupled to said first capacitor; and
        a second plurality of switches coupled to said second capacitor; and wherein said oscillator is implemented on a single integrated circuit.

3. The circuit in accordance with claim 2 wherein the first and second plurality of switches are MOSFET transistors.

4. The circuit in accordance with claim 2 wherein the flip-flop comprises:
    a first output for providing a first stable clock frequency independent of temperature variation and for controlling the first plurality of switches; and
    a second output for providing a second stable clock frequency independent of temperature variation which is the complement of the first stable clock frequency and for controlling the second plurality of switches.

5. The circuit in accordance with claim 2 wherein the first plurality of switches provides a charging path and a discharging path for the first capacitor.

6. The circuit in accordance with claim 2 wherein the second plurality of switches provides a charging path and a discharging path for the second capacitor.

7. The circuit in accordance with claim 5 wherein the discharging path for the first capacitor is connected to an input of a first comparator by one of the first plurality of switches.

8. The circuit in accordance with claim 6 wherein the discharging path of the second capacitor is connected to an input of a second comparator by one of the second plurality of switches.

9. A precision relaxation oscillator with temperature compensation circuit, said oscillator comprising:
    a first current generator having an output;
    a second current generator having an output; and
    an oscillation generator having an output and having an input coupled to the outputs of said first and second current generators, said input being arranged for receiving a current;
wherein said oscillation generator uses said current for generating an oscillation at the oscillation generator output;
wherein the first current generator comprises:
a first bias generator having an output; and
a first current mirror coupled to the output of the first bias generator for producing a first output current at the first current generator output, said first output current varying inversely with temperature;
and wherein said oscillator is implemented on a single integrated circuit.

10. The circuit in accordance with claim 9, wherein the first bias generator comprises:
a first amplifier circuit having an input and an output;
at least one transistor having a conduction control terminal coupled to the first amplifier circuit output; and
at least one resistor having a small positive temperature coefficient coupled to the input of the first amplifier circuit.

11. The circuit in accordance with claim 9 wherein the current mirror is comprised of a plurality of transistors which are individually selectable to produce the first output current.

12. The circuit in accordance with claim 10 wherein one of the at least one resistor is external to the single, integrated circuit for adjusting a stable clock frequency independent of temperature.

13. A precision relaxation oscillator with temperature compensation circuit, said oscillator comprising:
a first current generator having an output;
a second current generator having an output; and
an oscillation generator having an output and having an input coupled to the outputs of said first and second current generators, said input being arranged for receiving a current;
wherein said oscillation generator uses said current for generating an oscillation at the oscillation generator output;
wherein the second current generator comprises:
a second bias generator having an output; and
a second current mirror coupled to the output of the second bias generator for producing a second output current at the second current generator output, said second output current varying directly with temperature;
wherein the second bias generator comprises:
a second amplifier circuit having a first input, a second input, and an output, said second amplifier circuit output being coupled to the second bias generator output;
a first bias circuit having an output for producing a first bias voltage, said first bias circuit output being coupled to the second amplifier circuit first input; and
a second bias circuit having an output for producing a second bias voltage, said second bias circuit output being coupled to the second amplifier circuit second input; and wherein said oscillator is implemented on a single integrated circuit.

14. The circuit in accordance with claim 13 wherein the first circuit for producing a first bias voltage is comprised of at least one resistor having a small positive temperature coefficient.

15. The circuit in accordance with claim 14 wherein one of the at least one resistor is external to the single, integrated circuit.

16. A precision relaxation oscillator with temperature compensation circuit, said oscillator comprising:
a first current generator having an output;
a second current generator having an output; and
an oscillation generator having an output and having an input coupled to the outputs of said first and second current generators, said input being arranged for receiving a current;
wherein said oscillation generator uses said current for generating an oscillation at the oscillation generator output;
wherein the second current generator comprises:
a second bias generator having an output; and
a second current mirror coupled to the output of the second bias generator for producing a second output current at the second current generator output, said second output current varying directly with temperature;
wherein the second bias generator output is coupled to the oscillation generator for producing a reference voltage;
and wherein said oscillator is implemented on a single integrated circuit.

17. A precision relaxation oscillator with temperature compensation circuit, said oscillator comprising:
a first current generator having an output;
a second current generator having an output; and
an oscillation generator having an output and having an input coupled to the outputs of said first and second current generators, said input being arranged for receiving a current;
wherein said oscillation generator uses said current for generating an oscillation at the oscillation generator output;
wherein the second current generator comprises:
a second bias generator having an output; and
a second current mirror coupled to the output of the second bias generator for producing a second output current at the second current generator output, said second output current varying directly with temperature; wherein the second current mirror is comprised of a plurality of transistors which are individually selectable to produce the second output current; and wherein said oscillator is implemented on a single integrated circuit.

18. A precision relaxation oscillator with temperature compensation circuit, said oscillator comprising:
an oscillation generator having an input and an output, said oscillation generator being arranged for producing an oscillation at said output;
a first current generator having an output coupled to the oscillation generator input, said first current generator being arranged for producing a first output current that varies inversely with temperature; and
a second current generator having an output coupled to the oscillation generator input, said second current generator being arranged for producing a second output current that varies directly with temperature;
wherein the first and second current generators may be programmed to compensate for process, temperature and supply voltage variations;
wherein said oscillator is implemented on a single integrated circuit.

19. A precision relaxation oscillator with temperature compensation circuit, said oscillator comprising:
an oscillation generator having an input and an output, said oscillation generator being arranged for producing an oscillation at said output;

a first current generator having an output coupled to the oscillation generator input, said first current generator being arranged for producing a first output current that varies inversely with temperature; and a second current generator having an output coupled to the oscillation generator input, said second current generator being arranged for producing a second output current that varies directly with temperature;

wherein said first and second output currents are programmable;

and wherein said oscillator is implemented on a single integrated circuit.

20. The circuit in accordance with claim 19, wherein the first output current is combined with the second output current to form a combined current which is independent of temperature.

21. The circuit in accordance with claim 20 wherein the combined current is used by said oscillation generator for producing a stable clock frequency independent of temperature.

* * * * *